United States Patent [19]

Brown et al.

[11] Patent Number: 4,584,549

[45] Date of Patent: Apr. 22, 1986

[54] MAGNET SYSTEM

[75] Inventors: Ian J. Brown; John M. Bird, both of Oxon, England

[73] Assignee: Union Camp Corporation, Wayne, N.J.

[21] Appl. No.: 672,274

[22] Filed: Nov. 16, 1984

[30] Foreign Application Priority Data

Dec. 1, 1983 [GB] United Kingdom ............... 8332177

[51] Int. Cl.$^4$ .............................................. H01F 7/00
[52] U.S. Cl. .................................... 335/301; 335/211; 324/320
[58] Field of Search ....................... 335/211, 299, 301; 324/318, 319, 320

[56] References Cited

U.S. PATENT DOCUMENTS

| | | | |
|---|---|---|---|
| 3,423,670 | 1/1969 | Parker et al. | 335/301 X |
| 4,409,579 | 10/1983 | Clem | 335/216 |
| 4,484,814 | 11/1984 | Kawaguchi et al. | 335/301 |
| 4,490,675 | 12/1984 | Knuettel et al. | 324/319 |

Primary Examiner—George Harris
Attorney, Agent, or Firm—Kane, Dalsimer, Kane, Sullivan and Kurucz

[57] ABSTRACT

A magnet system comprises magnetic field generating means such as a superconducting magnet (12) and a shield including a number of sheets (9) of magnetic material, the size ($l_z$, $l_x$) and position (r) of the or each sheet (9) relatively to the magnetic field generating means (12) being such that in use at the edge of the sheet or sheets the component of magnetization ($M_z$) parallel to the sheet in the direction of the magnetic field is less than or substantially equal to zero.

8 Claims, 10 Drawing Figures

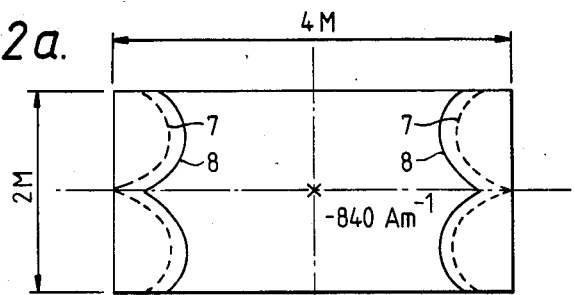
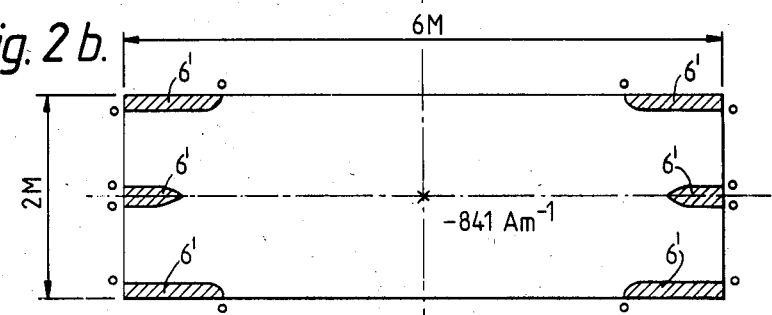
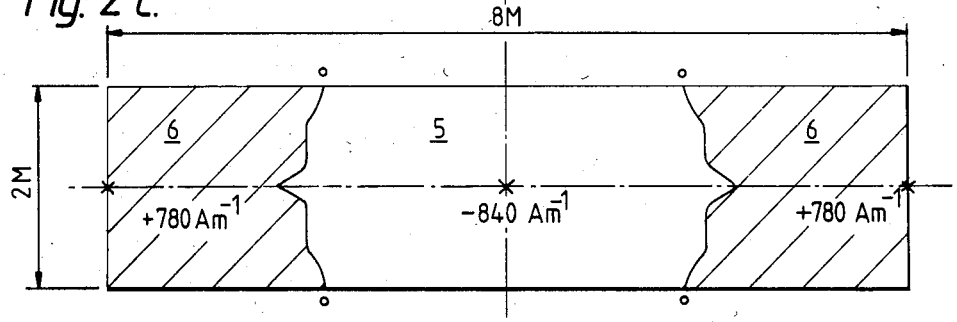

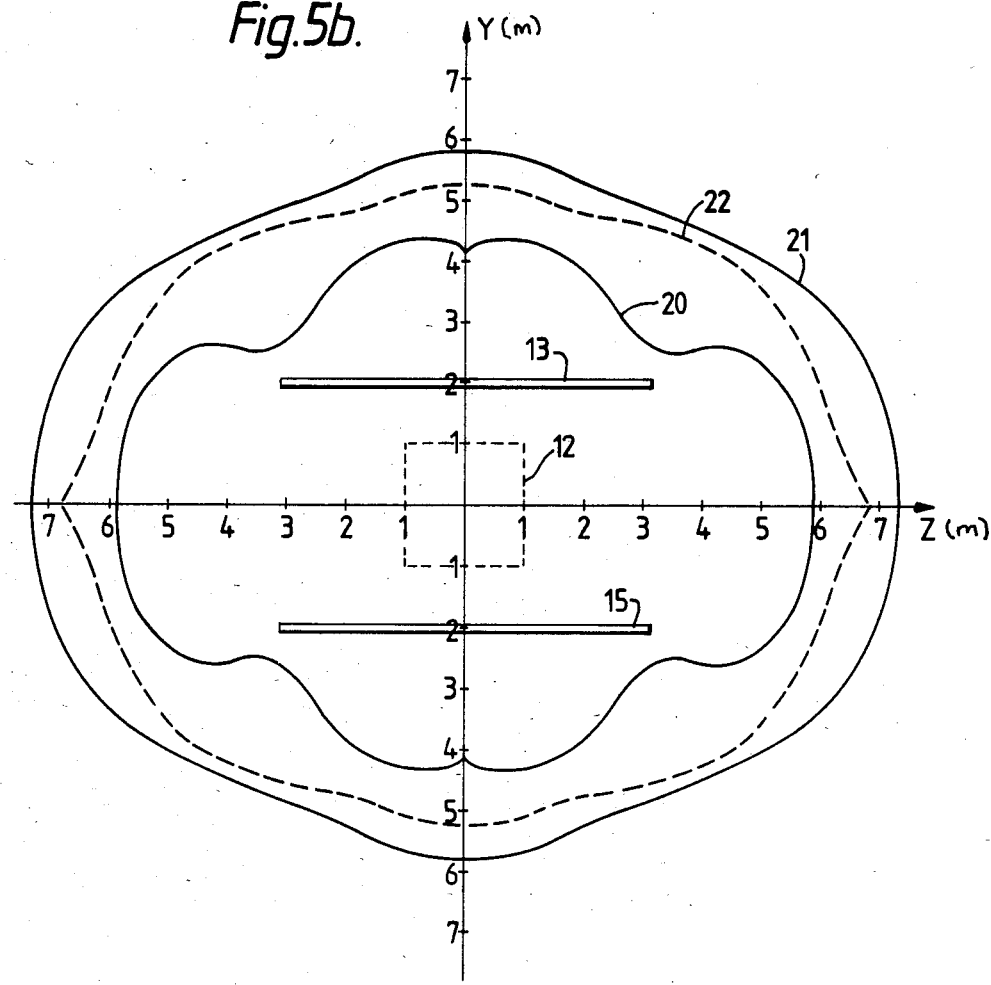

MAGNET SYSTEM

The invention relates to a magnet system including magnetic field generating means and a shield for screening the magnetic field generating means to a given degree.

There is a particular problem where large field strength magnets are employed in that it is desirable to screen the external magnetic field as much as possible. For example, in the field of nuclear magnetic resonance (NMR) imaging a magnet providing a bore field of about 0.5 T is required and such a magnet produces an undesirably strong external field over a wide area. It is thus desirable to screen the magnet and one possible solution would be to provide a perfectly spherical shell of magnetic material around the magnet with the magnet at the centre of the sphere.

In practice, a spherical shell is not obtainable and at present the walls of a room in which a magnet is positioned are lined with sheets of iron to approximate to a spherical shell. Such a shield provides a degree of screening but the weight of the iron sheets presents considerable problems in constructing the shield which is cumbersome and expensive.

In accordance with the present invention, a magnet system comprises magnetic field generating means; and a shield including at least one sheet of magnetic material, the size and position of the or each sheet relatively to the magnetic field generating means being such that in use at the edge of the sheet or sheets the component of magnetisation parallel to the sheet in the direction of the magnetic field is less than or substantially equal to zero.

The inventors have recognised that the arbitrary placing of a magnetic sheet in a magnetic field may cause an actual increase, rather than a decrease of the fringe magnetic field in their vicinity. If, however, the sheet of magnetic material is of such a size and position that the component of magnetisation parallel to the sheet in the direction of the magnetic field is less than or substantially equal to zero at the edge of the sheet then there will be no increase in magnetic field and a high proportion of magnetic flux will be constrained to flow through the plate producing an efficient screening effect. It should be recognised that the shield does not eliminate the external magnetic field on the side of the sheet remote from the magnetic field generating means but reduces it to a predetermined magnitude far more efficiently than the prior methods.

When the component of magnetisation parallel to the sheet in the direction of the magnetic field is less than zero at a particular point, this means that the magnetisation of the sheet at that point opposes the magnetic field due to the magnetic field generator.

The result of this invention is that a shield can be developed for use at predetermined distances from the magnetic field generating means (in general closer to the generating means than the walls of the room in which the system is located) and less magnetic material is required thus resulting in a cheaper and more convenient shield. In practice, the distance of the sheet or sheets from the magnetic field generating means will be determined so as to achieve the maximum screening effect possible for a given thickness of sheet.

Preferably, a plurality of sheets of magnetic material are provided around the magnetic field generating means parallel to the axis of the magnetic field.

This construction leads to a particularly advantageous arrangement in which sheets at each end of the magnetic field generating means transverse to the axis can be omitted since the sheets parallel to the axis provide an optimum return path for the magnetic flux. This is particularly useful in the case of NMR imaging where access to the bore of the magnetic field generating means (normally a superconducting magnet) is important.

Although it is most efficient to provide the shield completely around the axis of the magnetic field, in some systems one or more of the sheets may be omitted without degrading significantly the shielding effect. In particular, where the system is housed on the ground floor of a building, the lowermost sheet may be removed since it is not generally required to screen the magnetic field in that direction.

Preferably, the component of magnetisation parallel to the or each sheet in the direction of the magnetic field, at the edge of the sheet, is substantially equal to zero but in some cases this requirement may lead to plates which are undesirably large. In such cases, the dimensions of the plate may be reduced but in this case, it is preferable if such a reduction is carried out in a symmetrical manner. Thus:

(a) it should be reduced symmetrically about its plane;
(b) a perpendicular to the sheet through the mid plane of the sheet should pass through the axis of the magnetic field generated by the magnetic field generating means; and
(c) if one sheet requires a change in its dimensions then all other sheets should be likewise modified so that all sheets are of the same size.

BRIEF DESCRIPTION OF THE DRAWING

Some examples of magnet systems in accordance with the invention will now be described with reference to the accompanying drawings, in which:

FIGS. 2A–2C illustrate the variation in the component of magnetisation parallel to three iron sheets of different sizes;

The magnetic field at any point in an iron plate placed in a magnetic field can be determined by using the well known scalar potential method. The total magnetic field intensity ($\bar{H}_T$) at any point in an iron plate is the sum of the field due to the magnetic field generator generating the magnetic field ($\bar{H}_G$) and the field due to the "magnetic charges" in the remainder of the iron plate ($\bar{H}_I$) whose presence is due to the affect of the magnetic field generated by the magnetic field generator. Thus:

$$\bar{H}_T = \bar{H}_G + \bar{H}_I \tag{1}$$

The magnetic field intensity ($\bar{H}_I$) due to the "magnetic charges" in the iron plate is given in general by the following equation $$\bar{H}_I = \frac{-\bar{\nabla}}{4\pi} \int_{\text{iron volume}} \bar{M} \cdot \nabla\left(\frac{I}{|R|}\right) dV_I \quad (2)$$

Where M is the magnetisation (or "magnetic charge density"), and R is the length of a line joining the point where the field is to be measured and the positions of the specific "magnetic charges" being considered.

The "magnetic charge density" (M) at any given point is given by:

$$\bar{M} = \chi \bar{H} \quad (3)$$

Where $\chi$ is the magnetic susceptability of the magnetic material forming the plate, in this case iron. Thus, the magnetic field intensity at any point P in the iron plate as a function of the fields at all possible points Q is given by:

$$\bar{H}_p = \frac{-\bar{\nabla}}{4\pi} \int_{\text{iron volume}} \chi \bar{H}_Q \cdot \bar{\nabla}\left(\frac{I}{|R|}\right) dV_I + \bar{H}_G \quad (4)$$

Figure 1:
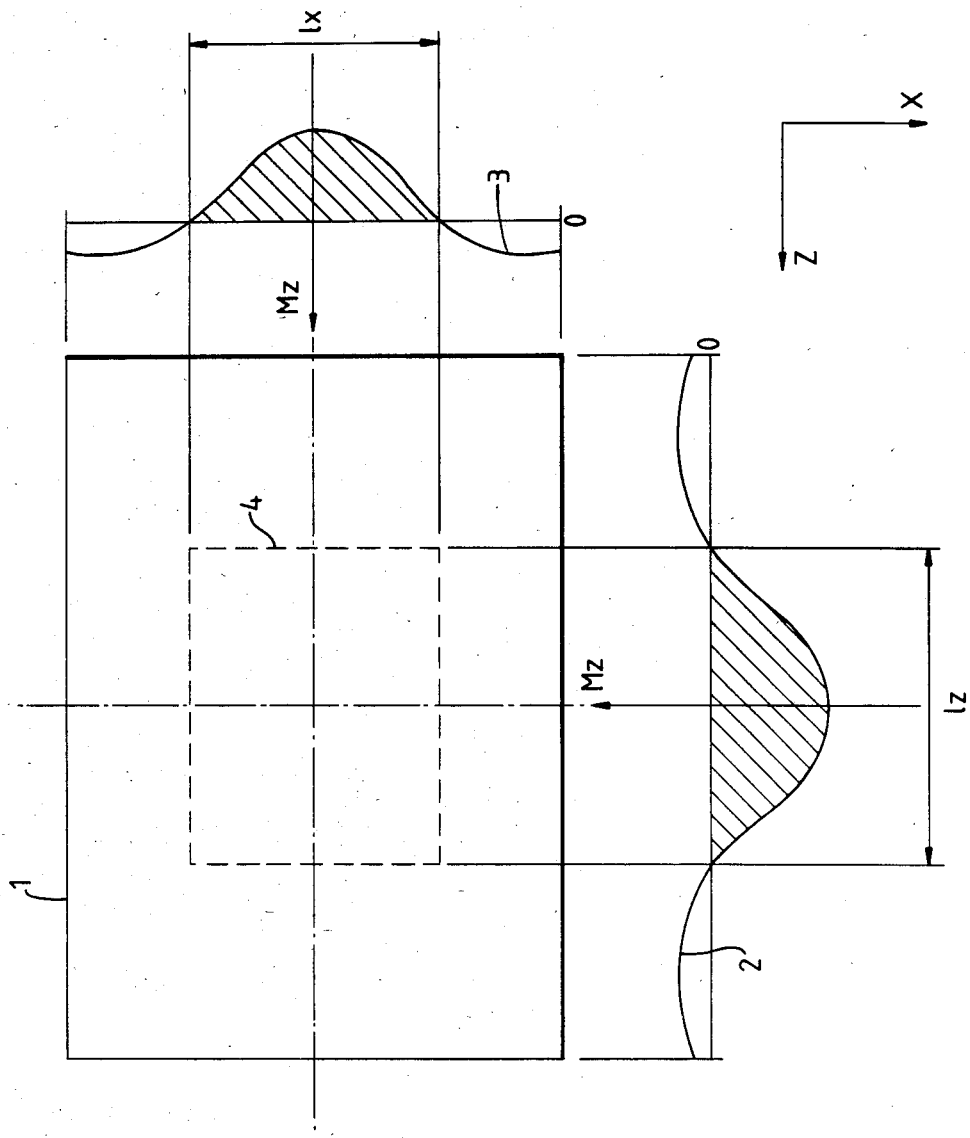
FIG. 1 is a schematic view of an iron sheet illustrating the variation in the component of magnetisation parallel to the sheet.

The solution of equation (4) can be determined for plates of different dimensions and is illustrated graphically in FIG. 1. FIG. 1 illustrates an iron plate 1 of rectangular form with curves 2, 3 illustrating the variation in mutually perpendicular directions X,Z, of the components of magnetisation ($M_z$) parallel to the plate 1 where the axis of the magnetic field generated by a superconducting coil (not shown) lies in the Z direction. The inner dashed line 4 in FIG. 1 illustrates how the critical dimensions of a particular plane can be determined. The line 4 lies along the locus of points where the magnetisation is substantially perpendicular to the plate 1 (i.e. the $M_z$ component is zero.) Within the area of the plate defined by the line 4, the $M_z$ component is less than zero.

The differences between plates of different dimensions can be seen more clearly with reference to FIG. 2. FIGS. 2A-2C illustrate three plates of the same thickness (0.5 inches) and width (2 meters) but of varying lengths and the $M_z$ magnetisation when each plate has been positioned parallel with the axis of and at two meters from a superconducting solenoid (not shown) generating a bore field of 0.5 T.

The plate shown in FIG. 2C has a length of 8 meters and an area 5 where the $M_z$ component of magnetisation is negative and opposes the magnetic field but also large area 6 where the $M_z$ component of magnetisation is positive which is undesirable.

The plate shown in FIG. 2B has a length of 6 meters and is of the optimum size in which the ($M_z$) component of magnetisation parallel to the plate at the edges of the plate is substantially zero. It will be seen from this figure that by "substantially" we mean that it is possible for there to be small portions of the plate where $M_z$ is positive but these portions are small relatively to the overall dimensions of the plate. The areas of positive $M_z$ are indicated by reference to numeral 6'.

The plate shown in FIG. 2A has a length of 4 meters and has no areas where $M_z$ is positive and will therefore only reduce the external field. However, by virtue of its shorter length it will have fewer "negative charges" and will thus be less effective at reducing the external field than the plate shown in FIG. 2B. In the FIG. 2A plate, contours 7, 8 illustrate the locus of points where the $M_z$ component of magnetisation is −700 and −800 A/M respectively.

In practice, for any particular magnet, equation (4) is solved with the premise that each plate should be of rectangular form, have a predetermined thickness (for example 0.5 inches) and be positioned at a predetermined distance from the magnet. These constraints are determined from practical considerations. For example, the thickness is chosen to correspond to the number of "negative charges" required to make the desired reduction in external field while the distance from the magnetic field generator will be governed by the size of the room in which the assembly is sited. This enables equation (4) to be solved at least by computer to define the dimensions of plates where the component of magnetisation parallel to the plate in the direction of the magnetic field, at the edges of the plate, will be substantially zero.

Figure 3:
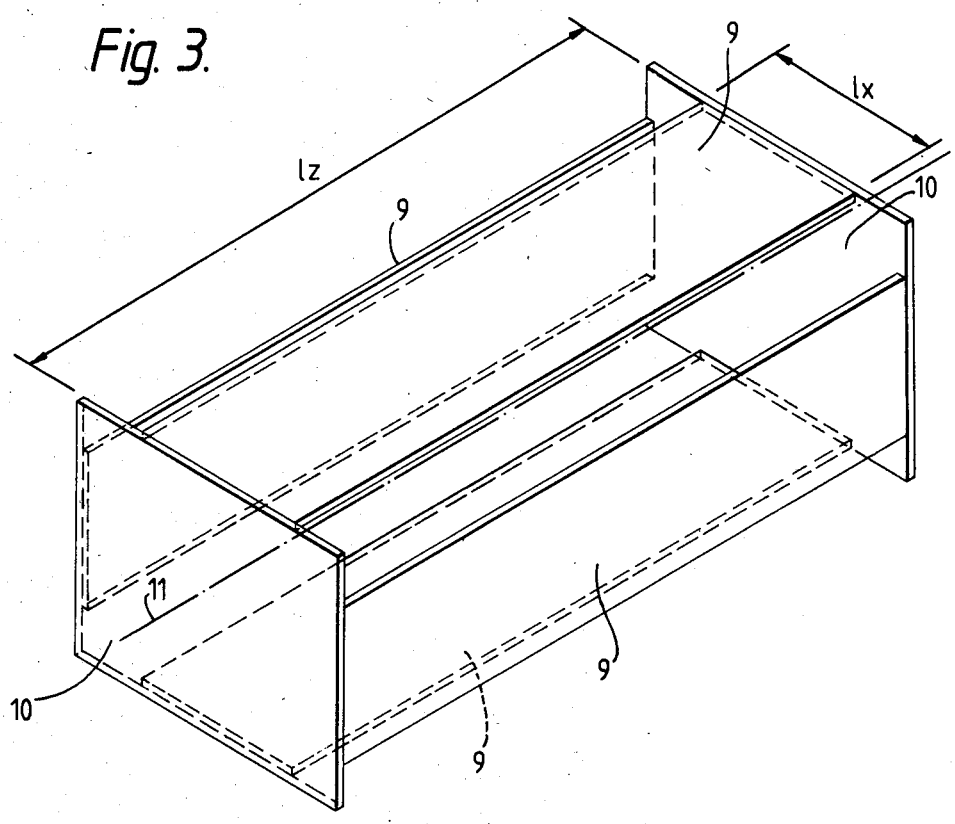
FIG. 3 illustrates a complete shield.

FIG. 3 illustrates a shield (for a magnet which has been omitted for clarity) which comprises four rectangular plates 9 parallel with and equally spaced from an axis 11 of the magnetic field and two end plates 10 transverse to the axis of the magnetic field. Where the magnet is a solenoid the axis 11 will correspond to the axis of the solenoid.

It will be seen in FIG. 3 that the plates 9 which are of the relevant critical dimensions do not completely enclose the space between the plates.

Figure 4:
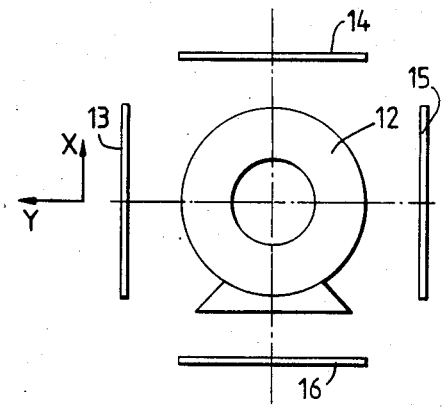
FIGS. 4A–4C are schematic end, side, and perspective views respectively of NMR imaging apparatus incorporating a shield according to the invention, the magnet being omitted in FIG. 4C; and, FIGS. 5A and 5B illustrate the magnitude of the external magnetic field generated by the apparatus shown in FIGS. 4A–4C.
Figure 4:
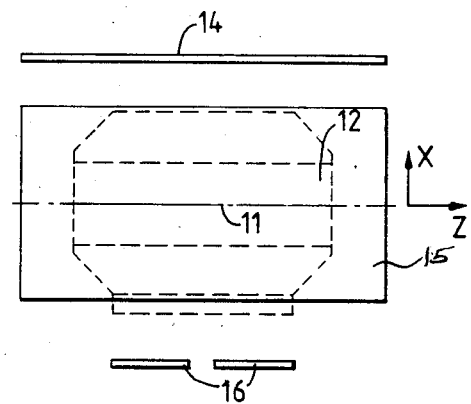
Figure 4C:
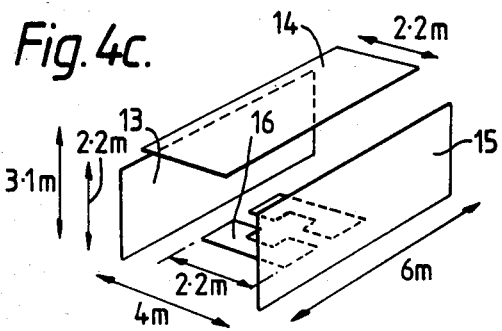

FIGS. 4A and 4B illustrate schematically a shielded superconducting magnet 12. FIG. 4C is a perspective view of the shield with the magnet 12 omitted. The shield comprises three rectangular iron plates 13-15 arranged on either side and above the magnet 12 and a small base plate 16 arranged under the magnet 12. All the plates 13-16 have a thickness of 12.7 mm and a width of 2.2 m. The plates 13-15 have a length of six meters. The base plate 16 is small in this example since the magnet rests on the floor of a building. In some cases, the base plate 16 could be omitted completely in this situation.

It will be seen from FIG. 4C and from FIGS. 5A, 5B (to be described below) that the plates 13-16 are positioned relatively closely together and hence close to the magnet 12. In this example, end plates have been omitted to allow easy access to the bore of the magnet 12.

Figure 5A:
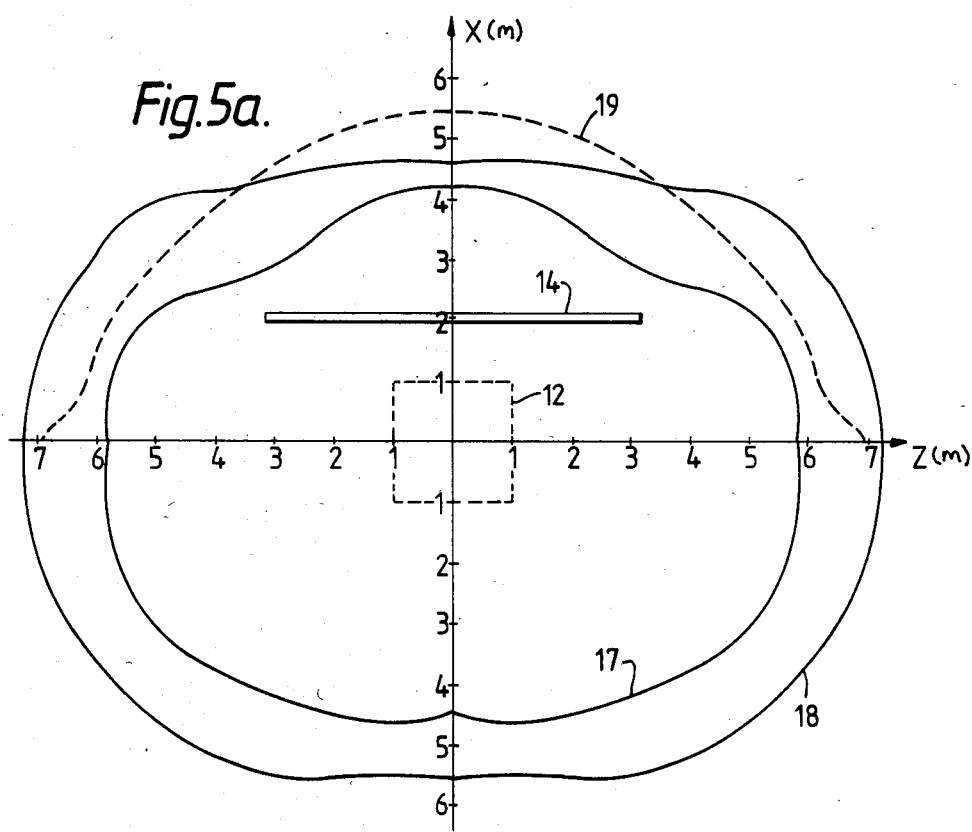

FIGS. 5A and 5B illustrate the form of the magnetic field around the magnet 12 generating a 0.5 T bore field in both the shielded and unshielded condition. The magnet 12 is indicated by dashed lines in both diagrams while the plates 13-15 have also been indicated.

FIG. 5A illustrates the magnetic field in the X-Z plane with a line 17 indicating the position where the external field has a value of 10 Gauss, and a line 18 indicating where the external magnetic field is 5 Gauss. For comparison, a dashed line 19 indicates where the external field would have a magnitude of 10 Gauss if the magnet 12 was unshielded. It will be seen that a significant reduction in the extent of the external field has been achieved.

FIG. 5B is similar to 5A but illustrating the external field in the Y-Z plane. A line 20 indicates where the external magnetic field has a magnitude of 10 Gauss and a line 21 indicates where the external magnetic field has a magnitude of 5 Gauss. A dashed line 22 indicates where the external field would have a magnitude of 10 Gauss if the magnet 12 was unshielded.

We claim:

1. A magnet system comprising magnetic field generating means; and a shield including at least one sheet of magnetic material positioned relatively to said magnetic field generating means whereby said magnetic field generating means generates a magnetic field which interacts with said at least one sheet, the dimensions defined by said at least one sheet and the position of said at least one sheet relatively to said magnetic field generating means being preselected such that at the edge of said at least one sheet the component of magnetisation parallel to said sheet in the direction of the magnetic field is less than zero.

2. A system according to claim 1, wherein said shield is made of iron.

3. A system according to claim 1, wherein the or each said sheet is rectangular.

4. A system according to claim 1, wherein said shield comprises a plurality of said sheets of magnetic material positioned around said magnetic field generating means parallel to the axis of said magnetic field generated by said magnetic field generating means.

5. A magnet system comprising magnetic field generating means; and a shield including at least one sheet of magnetic material positioned relatively to said magnetic field generating means whereby said magnetic field generating means generates a magnetic field which interacts with said at least one sheet, the dimensions defined by said at least one sheet and the position of said at least one sheet relatively to said magnetic field generating means being preselected such that at the edge of said at least one sheet the component of magnetisation parallel to said sheet in the direction of the magnetic field is substantially equal to zero.

6. A system according to claim 5, wherein said shield is made of iron.

7. A system according to claim 5, wherein the or each said sheet is rectangular.

8. A system according to claim 5, wherein said shield comprises a plurality of said sheets of magnetic material positioned around said magnetic field generating means parallel to the axis of said magnetic field generated by said magnetic field generating means.

* * * * *

UNITED STATES PATENT AND TRADEMARK OFFICE
CERTIFICATE OF CORRECTION

PATENT NO. : 4,584,549
DATED : April 22, 1986
INVENTOR(S) : Ian J. Brown and John M. Bird It is certified that error appears in the above-identified patent and that said Letters Patent is hereby corrected as shown below:

Page 1, face page of patent; under Assignee "Union Camp Corporation" should read -- Oxford Magnet Technology Limited -- .

Signed and Sealed this

Twenty-ninth Day of July 1986

[SEAL]

Attest:

DONALD J. QUIGG

Attesting Officer

Commissioner of Patents and Trademarks